United States Patent
Liu et al.

(10) Patent No.: US 11,719,856 B2
(45) Date of Patent: Aug. 8, 2023

(54) DETERMINATION OF HYDROCARBON PRODUCTION RATES FOR AN UNCONVENTIONAL HYDROCARBON RESERVOIR

(71) Applicant: Saudi Arabian Oil Company, Dhahran (SA)

(72) Inventors: Huihai Liu, Katy, TX (US);
Mohammed Boudjatit, Jijel (DZ);
Mustafa A. Basri, Dhahran (SA);
Rebah Mesdour, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 322 days.

(21) Appl. No.: 17/076,599

(22) Filed: Oct. 21, 2020

(65) Prior Publication Data
US 2021/0124087 A1   Apr. 29, 2021

Related U.S. Application Data

(60) Provisional application No. 62/927,441, filed on Oct. 29, 2019.

(51) Int. Cl.
*G01V 99/00* (2009.01)
*E21B 49/08* (2006.01)
(Continued)

(52) U.S. Cl.
CPC .......... *G01V 99/005* (2013.01); *E21B 49/087* (2013.01); *G06F 30/28* (2020.01);
(Continued)

(58) Field of Classification Search
USPC .......................................................... 702/13
See application file for complete search history.

(56) References Cited

U.S. PATENT DOCUMENTS 9,187,984 B2   11/2015   Usadi et al.
9,747,393 B2 *   8/2017   Dasari ................. G01V 99/005
(Continued)

FOREIGN PATENT DOCUMENTS

WO   WO 2019217131   11/2019
WO   WO 2020040829    2/2020
WO   WO 2020112141    6/2020

OTHER PUBLICATIONS

Anderson et al., "Petroleum Analytics Learning Machine to Forecast Production in the Wet Gas Marcellus Shale," Unconventional Resources Technology Conference, Jan. 2016, 17 pages.
(Continued)

*Primary Examiner* — Paul D Lee
(74) *Attorney, Agent, or Firm* — Fish & Richardson P.C.

(57) ABSTRACT

Methods for predicting hydrocarbon production rates for a hydrocarbon reservoir include receiving data from a hydrocarbon reservoir. The data includes reservoir characterization data, well log data, and hydraulic fracturing data. A physics-constrained machine learning model predicts a hydrocarbon production rate for the hydrocarbon reservoir as a function of time. The physics-constrained machine learning model includes an artificial neural network and a hydrocarbon fluid flow model. Predicting the hydrocarbon production rate includes generating, by the artificial neural network, multiple parameters of the hydrocarbon fluid flow model based on the data from the hydrocarbon reservoir. The hydrocarbon fluid flow model provides the predicted hydrocarbon production rate as a function of time based on the parameters. A display device of the computer system presents the predicted hydrocarbon production rate for the hydrocarbon reservoir as a function of time.

18 Claims, 6 Drawing Sheets

(51) Int. Cl.
*G06F 30/28* (2020.01)
*G06N 3/08* (2023.01)

(52) U.S. Cl.
CPC .......... *G06N 3/08* (2013.01); *E21B 2200/20* (2020.05); *E21B 2200/22* (2020.05)

(56) References Cited

U.S. PATENT DOCUMENTS

| | | | |
|---|---|---|---|
| 9,946,974 B2 | 4/2018 | Burch et al. | |
| 2007/0179767 A1 | 8/2007 | Cullick et al. | |
| 2010/0198570 A1 | 8/2010 | Sarma et al. | |
| 2013/0096899 A1 | 4/2013 | Usadi et al. | |
| 2015/0066463 A1* | 3/2015 | Shetty | E21B 41/00 703/10 |
| 2017/0145793 A1 | 5/2017 | Ounes | |
| 2019/0197208 A1* | 6/2019 | Borrel | E21B 41/00 |
| 2019/0249534 A1 | 8/2019 | Hoeink et al. | |
| 2021/0097390 A1* | 4/2021 | Liang | G01V 99/005 |

OTHER PUBLICATIONS

Cao et al., "Data Driven Production Forecasting Using Machine Learning," SPE 180984-MS, presented at the SPE Argentina Exploration and Production of Unconventional Resources Symposium held in Buenos Aires, Argentina, Society of Petroleum Engineers, Jun. 1, 2016, 10 pages.

Patzek et al., "Gas production in the Barnett shale obeys a simple scaling theory," PNAS, Dec. 2013, 110(49): 19731-19736.

Wikistat, "Neural networks and introduction to deep learning," 2017, retrieved from URL <https://www.math.univ-toulouse.fr/~besse/Wikistat/pdf/st-m-hdstat-rnn-deep-learning.pdf>, 17 pages.

PCT International Search Report and Written Opinion in International Appln. No. PCT/US2020/057639, dated Feb. 3, 2020, 14 pages.

* cited by examiner

500

Receive, by a computer system, data from a hydrocarbon reservoir, the data comprising reservoir characterization data, well log data, and hydraulic fracturing data of the hydrocarbon reservoir, the computer system comprising a physics-constrained machine learning model
504

Generate, by the physics-constrained machine learning model, a predicted hydrocarbon production rate for the hydrocarbon reservoir as a function of time, the physics-constrained machine learning model comprising an artificial neural network and a hydrocarbon fluid flow model of the hydrocarbon reservoir, the generating of the predicted hydrocarbon production rate comprising: generating, by the artificial neural network, a plurality of parameters of the hydrocarbon fluid flow model based on the data from the hydrocarbon reservoir, the hydrocarbon fluid flow model communicably coupled to the artificial neural network; and providing, by the hydrocarbon fluid flow model, the predicted hydrocarbon production rate as a function of time based on the plurality of parameters
508

Present, using a display device of the computer system, the predicted hydrocarbon production rate for the hydrocarbon reservoir as a function of time
512

FIG. 5

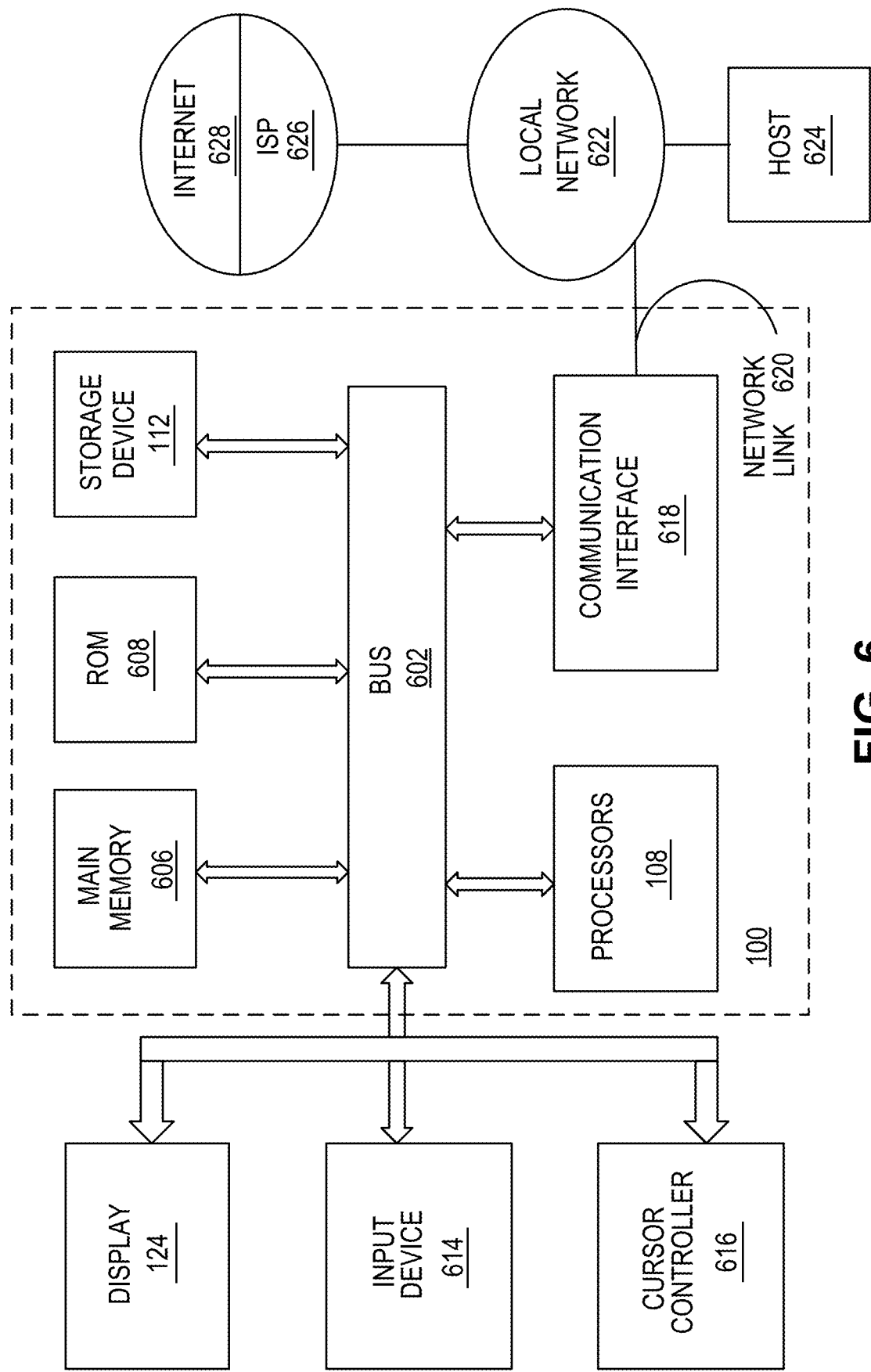

DETERMINATION OF HYDROCARBON PRODUCTION RATES FOR AN UNCONVENTIONAL HYDROCARBON RESERVOIR

CROSS-REFERENCE TO RELATED APPLICATION

This application claims the benefit of U.S. Provisional Application 62/927,441, filed on Oct. 29, 2019, the contents of which are incorporated herein by reference in their entirety.

TECHNICAL FIELD

This description relates generally to prediction of hydrocarbon production rates for a hydrocarbon reservoir.

BACKGROUND

Predicting hydrocarbon production rates for an unconventional reservoir poses challenges because the physics of fluid flow in an unconventional reservoir is often undefined. Traditional methods for prediction of hydrocarbon production rates are sometimes insufficient because the relationship between characterization data and production rates may not be known. Moreover, traditional methods for prediction of hydrocarbon production rates based on reservoir simulation may be computationally intensive.

SUMMARY

Methods for prediction of hydrocarbon production rates for a hydrocarbon reservoir are disclosed. In some implementations, the methods include using a computer system to receive data from a hydrocarbon reservoir. The data includes reservoir characterization data, well log data, and hydraulic fracturing data of the hydrocarbon reservoir. The computer system includes a physics-constrained machine learning model. The physics-constrained machine learning model predicts a hydrocarbon production rate for the hydrocarbon reservoir as a function of time. The physics-constrained machine learning model includes an artificial neural network and a hydrocarbon fluid flow model of the hydrocarbon reservoir. Predicting the hydrocarbon production rate includes generating, by the artificial neural network, multiple parameters of the hydrocarbon fluid flow model based on the data from the hydrocarbon reservoir. The hydrocarbon fluid flow model is communicably coupled to the artificial neural network. The hydrocarbon fluid flow model provides the predicted hydrocarbon production rate as a function of time based on the parameters. A display device of the computer system presents the predicted hydrocarbon production rate for the hydrocarbon reservoir as a function of time.

In some implementations, the data from the hydrocarbon reservoir includes at least one of a bottomhole pressure of the hydrocarbon reservoir; a wellhead pressure of the hydrocarbon reservoir; reservoir fluid pressure-volume-temperature (PVT) data of the hydrocarbon reservoir; a permeability and a porosity of the hydrocarbon reservoir; an initial reservoir pore pressure of the hydrocarbon reservoir; or formation layer data of the hydrocarbon reservoir.

In some implementations, the data from the hydrocarbon reservoir includes at least one of a hydraulic fracture geometry of the hydrocarbon reservoir; an injection rate of the hydrocarbon reservoir; or a mineral composition and an in situ stress of the hydrocarbon reservoir.

In some implementations, the hydrocarbon fluid flow model of the hydrocarbon reservoir represents a one-dimensional hydrocarbon fluid flow from the hydrocarbon reservoir to one or more hydraulic fractures.

In some implementations, the parameters of the hydrocarbon fluid flow model include a total hydraulic fracture area of the hydrocarbon reservoir; an average fracture spacing of the hydrocarbon reservoir; permeability and a porosity of the hydrocarbon reservoir; a hydrocarbon in place (HIP) metric of the hydrocarbon reservoir; a pressure drawdown of the hydrocarbon reservoir; and PVT data for producing fluids in the hydrocarbon reservoir.

In some implementations, the computer system generates training data for the physics-constrained machine learning model. The training data includes measured reservoir characterization data and measured hydraulic fracturing data of a plurality of hydrocarbon reservoirs; and measured hydrocarbon production rates and measured flowback rates of the plurality of hydrocarbon reservoirs. The computer system trains the physics-constrained machine learning model to generate predicted hydrocarbon production rates as a function of time for the hydrocarbon reservoirs based on the training data.

In some implementations, the training of the physics-constrained machine learning model includes updating, by the computer system, weights of the artificial neural network to minimize a difference between the predicted hydrocarbon production for the hydrocarbon reservoirs and the measured hydrocarbon production rates.

In some implementations, the computer system determines whether to drill a production well at a particular geographical location corresponding to the hydrocarbon reservoir. The determining is based on the predicted hydrocarbon production rate for the hydrocarbon reservoir as a function of time.

These and other aspects, features, and implementations can be expressed as methods, apparatus, systems, components, means, or steps for performing a function, and in other ways.

These and other aspects, features, and implementations will become apparent from the following descriptions, including the claims.

BRIEF DESCRIPTION OF THE DRAWINGS

FIG. 5 illustrates a process for predicting hydrocarbon production rates for an unconventional hydrocarbon reservoir, in accordance with one or more implementations.

FIG. 6 illustrates an implementation of a computer system for predicting hydrocarbon production rates for an unconventional hydrocarbon reservoir, in accordance with one or more implementations.

DETAILED DESCRIPTION

Figure 1:
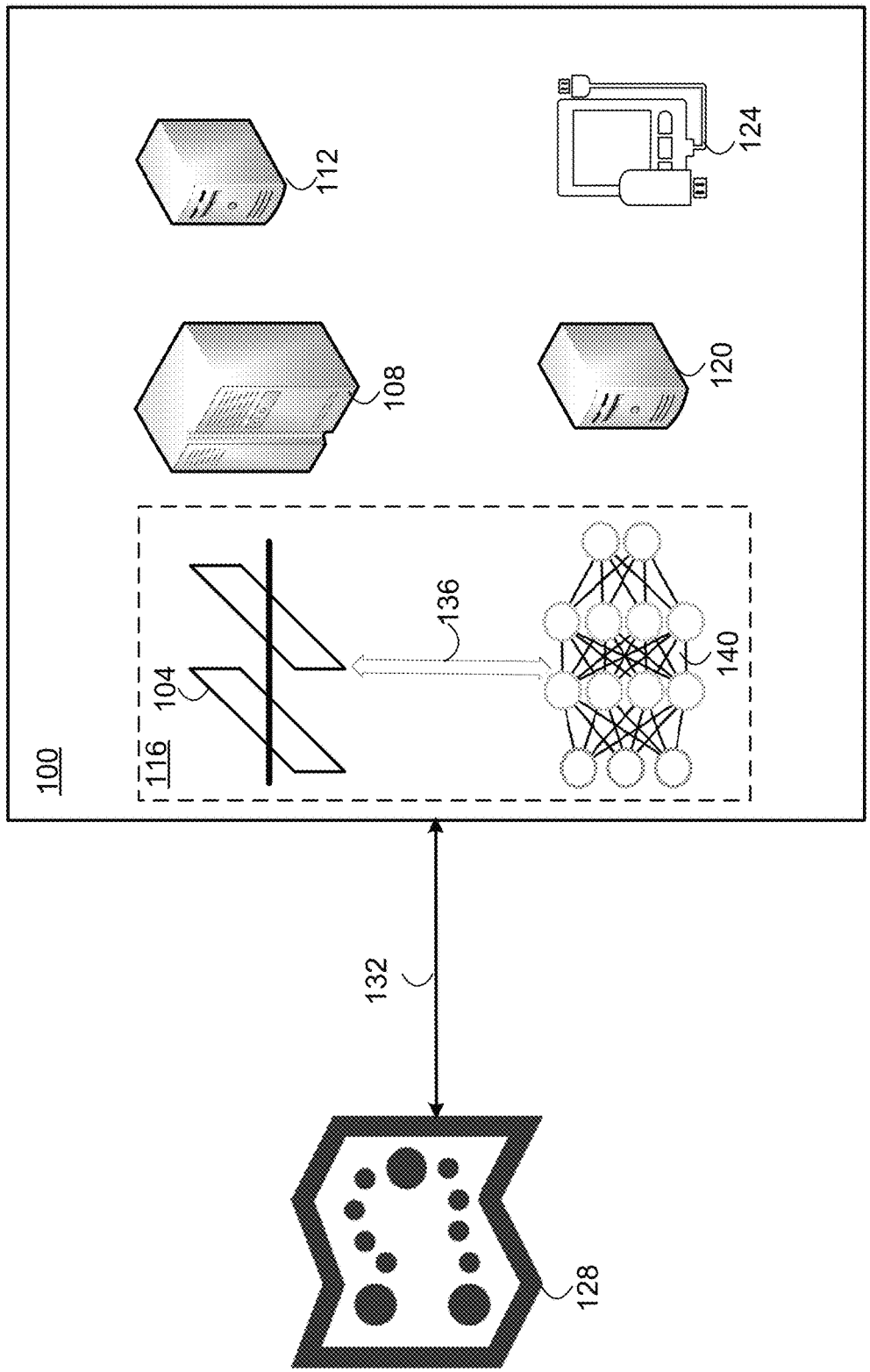
FIG. 1 illustrates a computer system for predicting hydrocarbon production rates for an unconventional hydrocarbon reservoir, in accordance with one or more implementations.

An unconventional hydrocarbon reservoir refers to an oil or gas reservoir having less permeability, such as a shale gas reservoir. Predicting hydrocarbon production rates for an unconventional reservoir as a function of time poses challenges because the physics of fluid flow in an unconventional reservoir is often undefined. Traditional methods for prediction of hydrocarbon production rates are sometimes insufficient because the relationship between reservoir characterization data and production rates may not be known for an unconventional reservoir. Moreover, traditional methods for prediction of hydrocarbon production rates based on reservoir simulation can be computationally intensive.

The implementations disclosed herein describe methods and systems to integrate the physics of fluid flow with machine learning, or physics-constrained machine learning, to predict production rates for an unconventional hydrocarbon reservoir as a function of time. The disclosed methods and systems use measured reservoir characterization data, measured hydraulic fracturing data, and measured production rates of multiple hydrocarbon reservoirs and production wells to train a physics-constrained machine learning model. The physics-constrained machine learning model includes an artificial neural network to generate parameters that correspond to the physical mechanisms for fluid flow in the unconventional hydrocarbon reservoir. The physics-constrained machine learning model includes a reservoir flow model to predict hydrocarbon production rates for the hydrocarbon reservoir as a function of time based on the parameters.

Among other benefits and advantages of the implementations disclosed, the implementations provide an integrated and flexible physics-constrained machine learning architecture for predicting production rates as a function of time based on reservoir characterization data, hydraulic fracturing data, and well logs. Compared to traditional forecasting techniques, the disclosed methods and systems improve the prediction of production rates for unconventional hydrocarbon reservoirs when some but not all physical mechanisms of the hydrocarbon fluid flow are known, and when only short-term reservoir characterization data and hydraulic fracturing data is known. The hydrocarbon fluid flow model is communicably coupled to the artificial neural network in a manner to constrain the outputs of the artificial neural network. The artificial neural network is thus constrained to provide meaningful outputs in accordance with the physics-based fluid flow of the hydrocarbon reservoir. The methods and systems disclosed herein are used for predicting the long-term production as a function of time for hydrocarbon production wells where only early production rate data is available. Moreover, the methods and systems are used to estimate potential production as a function of time at geographical locations where production wells are not drilled yet. Therefore, optimal geographical locations for drilling production wells are determined.

FIG. 1 illustrates a computer system 100 for predicting production rates for an unconventional hydrocarbon reservoir 128 as a function of time, in accordance with one or more implementations. Among other components and parts, FIG. 1 illustrates the hydrocarbon reservoir 128, data 132, and the computer system 100. Data measuring or logging instruments at the hydrocarbon reservoir 128 are communicably coupled to the computer system 100 to transmit the data 132 over a network such as the Internet 628 or the local network 622 illustrated and described in more detail later with reference to FIG. 6.

The hydrocarbon reservoir 128 includes borings in the earth that are constructed to bring petroleum oil hydrocarbons and natural gas to the surface. The hydrocarbon reservoir 128 is enabled to produce oil or gas by implementing perforations (or other means such as open hole completions) to provide a path for the oil to flow from the surrounding rock into tubing. Acids and fracturing fluids are pumped into the hydrocarbon reservoir 128 to stimulate the reservoir rock to optimally produce hydrocarbons. In some implementations, the computer system 100 is communicably coupled to the hydrocarbon reservoir 128 to receive the data 132 from the hydrocarbon reservoir 128. The data 132 is used to extract reservoir characterization data, hydraulic fracturing data, well logs, or a combination. In other implementations, the extraction of the reservoir characterization data or hydraulic fracturing data is performed locally at the hydrocarbon reservoir 128; the reservoir characterization data and hydraulic fracturing data are thus communicated to the computer system 100 over a network.

The data 132 includes reservoir characterization data, well log data, and hydraulic fracturing data of the hydrocarbon reservoir 128. Characterization of a hydrocarbon reservoir refers to a process performed to determine attributes (reservoir characterization data) of the reservoir rocks and fluids for the purpose of producing hydrocarbon fluids from the hydrocarbon reservoir. Well logging refers to the practice of making a detailed record (well log data) of physical measurements made by instruments lowered into a hydrocarbon reservoir. Hydraulic fracturing refers to a process of producing hydrocarbons from unconventional reservoirs by injecting fracking fluids into the rock. Data related to the hydraulic fracturing process is the hydraulic fracturing data included in the data 132.

The data 132 from the hydrocarbon reservoir 128 includes a bottomhole pressure of the hydrocarbon reservoir 128. The bottomhole pressure refers to a hydrostatic pressure on the annular side of the hydrocarbon reservoir 128. The data 132 includes a wellhead pressure of the hydrocarbon reservoir 128. A wellhead is a pressure-containing component at the surface of an oil well that provides the interface for drilling, completion, and testing. The wellhead pressure is measured by pressure gauges of the wellhead fittings. The data 132 includes reservoir fluid pressure-volume-temperature (PVT) data of the hydrocarbon reservoir 128. The PVT data refers to the fluid properties (such as density, viscosity, or a combination) as a function of the pressure, volume, and temperature. The data 132 includes a permeability and a porosity of the hydrocarbon reservoir 128. The permeability is the ability to preferentially flow a particular fluid through a rock when other immiscible fluids are present in the reservoir. The porosity refers to an interconnected pore volume in a rock that contributes to fluid flow in the hydrocarbon reservoir 128.

The data 132 includes an initial reservoir pore pressure of the hydrocarbon reservoir 128. When impermeable rocks such as shale forms, the pore fluids sometimes support the total overlying rock column, leading to greater formation pressures. Because reservoir pressure changes as fluids are produced from a hydrocarbon reservoir, the reservoir pore pressure is measured at a specific time, such as initial reservoir pore pressure. The data 132 includes formation layer data of the hydrocarbon reservoir 128. The formation layer data includes thickness of the formation layers and data representing the geological formation, lithology (such as color, texture, grain size, composition, or a combination), or facies (such as fossil content).

The data 132 from the hydrocarbon reservoir 128 includes a hydraulic fracture geometry of the hydrocarbon reservoir 128. In some implementations, the hydraulic fracture geometry is modeled as a two-dimensional plane-strain model in a horizontal plane with a constant fracture height larger than the fracture length. In other implementations, the hydraulic fracture geometry is modeled as an elliptical horizontal cross-section and rectangular vertical cross-section where the fracture width is independent of the fracture height and is constant in the vertical direction. The data 132 includes an injection rate of the fracturing fluids. The injection rate refers to the rate at which the fracking fluid is injected into the wellbore to create cracks in the deep-rock formations. The data 132 includes a mineral composition of the hydrocarbon reservoir 128. The mineral composition includes a proportion of quartz, feldspar, limestone, dolostone, or other minerals. The data 132 includes an in situ stress of the hydrocarbon reservoir 128. The in situ stress represents a stress state at a particular depth, such as a vertical stress, a minimum horizontal stress, and a maximum horizontal stress.

The computer system 100 is used to train the physics-constrained machine learning model 116 to generate a predicted hydrocarbon production rate for the hydrocarbon reservoir 128 as a function of time. An implementation of the computer system 100 is illustrated and described in more detail later with reference to FIG. 6. The computer system 100 includes a physics-constrained machine learning model 116, one or more computer processors 108, a storage device 112, training data 120, and a display device 124. The computer processors 108 are computer hardware used to perform the methods disclosed herein. The computer processors 108 are illustrated and described in more detail later with reference to FIG. 6. The storage device 112 is used to store the data 132 (such as reservoir characterization data, hydraulic fracturing data, well log data, or a combination) and instructions to perform the methods disclosed herein. The storage device 112 is illustrated and described in more detail later with reference to FIG. 6.

The physics-constrained machine learning model 116 includes a combination of a physics-based reservoir flow model (the hydrocarbon fluid flow model 104) and an artificial neural network 140 (a machine learning algorithm). The artificial neural network 140 generates multiple parameters 136 of the hydrocarbon fluid flow model 104 based on the data 132 from the hydrocarbon reservoir 128. The hydrocarbon fluid flow model 104 is communicably coupled to the artificial neural network 140 to form the physics-constrained machine learning model 116. The coupling constrains the outputs of the artificial neural network 140 to produce meaningful outputs in accordance with the physics-based reservoir flow model (the hydrocarbon fluid flow model 104). The hydrocarbon fluid flow model 104 provides the predicted hydrocarbon production rate as a function of time based on the parameters 136. The physics-constrained machine learning model 116 thus combines the physics of fluid flow with machine learning to provide more meaningful predictions of hydrocarbon production rates.

The computer system 100 extracts the training data 120 for the physics-constrained machine learning model 116 from measured, historical data of multiple hydrocarbon reservoirs and multiple production wells. In some implementations, the training data 120 is stored on the storage device 112. The training data 120 includes measured reservoir characterization data, measured hydraulic fracturing data, measured hydrocarbon production rates, and measured flowback rates of the multiple hydrocarbon reservoirs and multiple production wells. The computer system 100 aggregates the measured, historical hydrocarbon production rates as a function of time from the multiple hydrocarbon reservoirs and multiple production wells into the training data 120 to verify the hydrocarbon production prediction results and train the physics-constrained machine learning model 116.

In some implementations, the computer system 100 reduces redundancy in the training data 120 by transforming the training data 120 into a reduced set of features (one or more feature vectors). The feature vectors contain the relevant information from the training data 120, such that features of interest are identified by the physics-constrained machine learning model 116 using the reduced representation instead of the complete training data. In some implementations, the following dimensionality reduction techniques are used by the computer system 100 to reduce a dimensionality of the feature vectors: independent component analysis, Isomap, latent semantic analysis, partial least squares, principal component analysis, multifactor dimensionality reduction, or nonlinear dimensionality reduction.

The computer system 100 trains the physics-constrained machine learning model 116, using the training data 120, to generate predicted hydrocarbon production rates as a function of time for the multiple reservoirs and production wells. The training process minimizes a difference between the predicted hydrocarbon production rates and measured hydrocarbon production rates (from the training data 120). In some implementations, the physics-constrained machine learning model 116 determines a score for the data 132 from the hydrocarbon reservoir 128. The score can be indicative of a likelihood that the hydrocarbon reservoir 128 will have a particular hydrocarbon production rate at a particular time. In some implementations, the computer system 100 applies one or more machine learning methods (such as backpropagation) to train the physics-constrained machine learning model 116 that when applied to the data 132 from the hydrocarbon reservoir 128, outputs indications of whether an economical production rate is expected at a particular geographical location. Thus, the computer system 100 is used to determine whether to drill a production well at a particular geographical location corresponding to the hydrocarbon reservoir 128. The determining is based on the predicted hydrocarbon production rate for the hydrocarbon reservoir 128 as a function of time.

The display device 124 displays results of the processing by the processors 108 to a user. The display device 124 is illustrated and described in more detail later with reference to FIG. 6. In some implementations, the display device 124 presents the predicted hydrocarbon production rate for the hydrocarbon reservoir 128 as a function of time, for example, a number of 42-gallon barrels ("bbl.") or metric tonnes per day. In other implementations, the display device 124 presents a determination of whether to drill a production well at a particular geographical location corresponding to the hydrocarbon reservoir 128. The computer system determines whether to drill the production well at the particular geographical location based on the predicted hydrocarbon production rate for the hydrocarbon reservoir 128. For example, if the predicted hydrocarbon production rate at a particular time is greater than a threshold (such as 150,000 bbl./day), the computer system 100 can determine that the geographical location is a sweet spot for drilling a production well.

Figure 2:
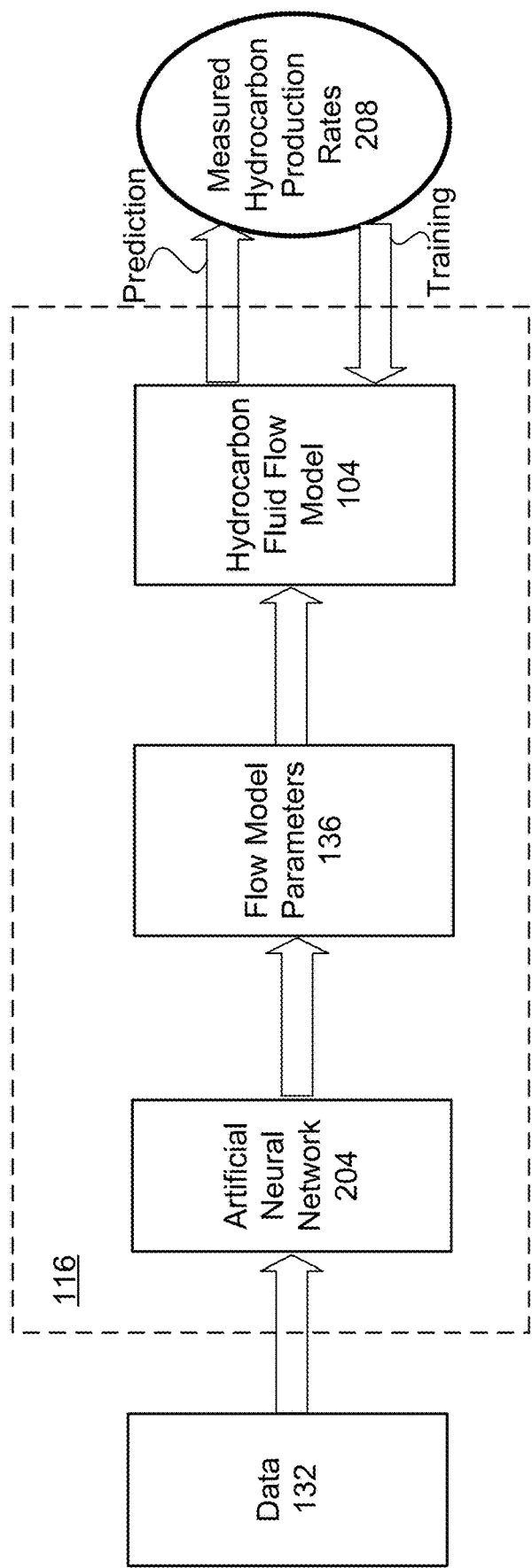
FIG. 2 illustrates a physics-constrained machine learning model, in accordance with one or more implementations.

FIG. 2 illustrates a physics-constrained machine learning model 116, in accordance with one or more implementations. The physics-constrained machine learning model 116 combines an artificial neural network 204 machine learning algorithm with a physics-based hydrocarbon fluid flow model 104. FIG. 2 further includes the input data 132 for the physics-constrained machine learning model 116, the parameters 136 of the hydrocarbon fluid flow model 104, and measured hydrocarbon production rates 208 of multiple hydrocarbon reservoirs and production wells. The physics-constrained machine learning model 116 is implemented using the computer hardware described and illustrated in more detail below with reference to FIG. 6.

The data 132 used as input to the physics-constrained machine learning model 116 includes the reservoir characterization data, well log data, and hydraulic fracturing data from the hydrocarbon reservoir 128 as described in more detail with reference to FIG. 1. The physics-constrained machine learning model 116 predicts a hydrocarbon production rate for the hydrocarbon reservoir 128 as a function of time. The predicting the hydrocarbon production rate includes generating multiple parameters 136 of the hydrocarbon fluid flow model 104 by the artificial neural network 204 based on the data 132. The generation of the multiple parameters 136 by the artificial neural network 204 is illustrated and described in more detail later with reference to FIG. 3. The parameters 136 of the hydrocarbon fluid flow model 104 include a total hydraulic fracture area, an average fracture spacing, a permeability and a porosity of the hydrocarbon reservoir 128, a hydrocarbon in place (HIP) metric, a pressure drawdown of the hydrocarbon reservoir 128, and PVT data for producing fluids in the hydrocarbon reservoir 128 as described in more detail later with reference to FIG. 4.

The computer system 100 predicts the hydrocarbon production rate for the hydrocarbon reservoir 128 using the hydrocarbon fluid flow model 104. The hydrocarbon fluid flow model 104 is communicably coupled to the artificial neural network 140 to provide the predicted hydrocarbon production rate as a function of time based on the parameters 136. The hydrocarbon fluid flow model 104 represents a physics-based one-dimensional hydrocarbon fluid flow from the hydrocarbon reservoir 128 to one or more hydraulic fractures. In some implementations, the computer system 100 determines whether to drill a hydrocarbon production well at a particular geographical location corresponding to the hydrocarbon reservoir 128 based on the predicted hydrocarbon production rate. The hydrocarbon fluid flow model 104 is illustrated and described in more detail later with reference to FIG. 4.

In some implementations, the computer system 100 generates the training data 120 for the physics-constrained machine learning model 116 as described in more detail with reference to FIG. 1. The training data 120 includes measured reservoir characterization data and measured hydraulic fracturing data of multiple hydrocarbon reservoirs. The training data 120 further includes measured hydrocarbon production rates 208 and measured flowback rates of the multiple hydrocarbon reservoirs. The computer system 100 trains the physics-constrained machine learning model 116 to generate predicted hydrocarbon production rates for multiple reservoirs and production wells as a function of time based on the training data 120. The training is performed using backpropagation. Backpropagation is a method used to efficiently train the artificial neural network 140 following a gradient descent approach that exploits the chain rule. A feature of backpropagation is iterative, recursive and efficient calculation of the weights updates to train the artificial neural network 140.

Figure 3:
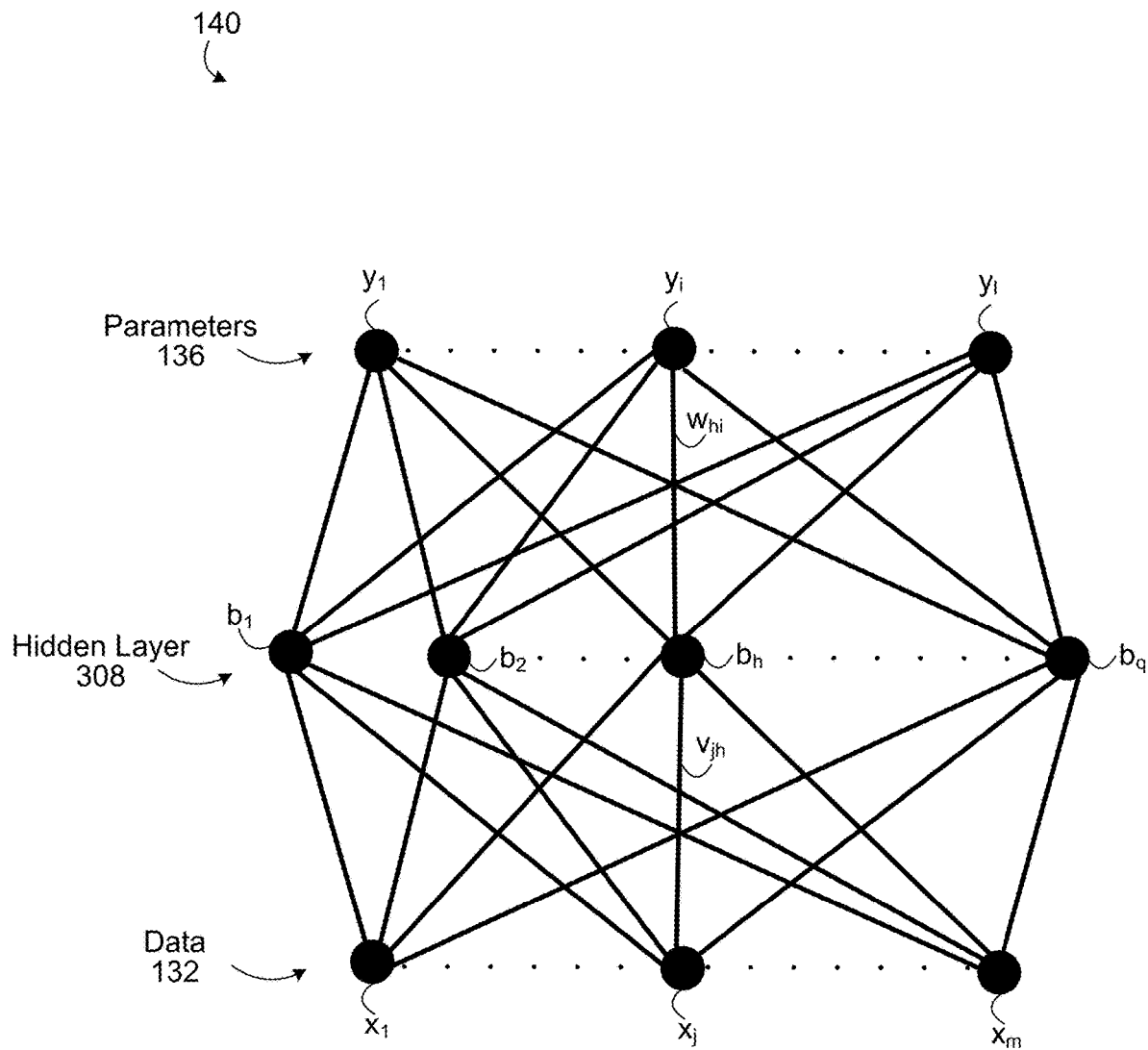
FIG. 3 illustrates a computational algorithm for an artificial neural network, in accordance with one or more implementations.

FIG. 3 illustrates a computational algorithm for an artificial neural network 140 of the physics-constrained machine learning model 116, in accordance with one or more implementations. Among other components and parts, the artificial neural network 140 includes nodes $x_1 \ldots x_m$ belonging to an input layer associated with the data 132 (reservoir characterization data and hydraulic fracturing data), nodes $b_1 \ldots b_q$ belonging to a hidden layer 308, and nodes $y_1 \ldots y_l$ belonging to an output layer associated with the parameters 136. The parameters 136 are generated by executing the machine learning algorithm for the artificial neural network 140 based on the data 132.

FIG. 3 illustrates only one hidden layer 308 for ease of description; the methods disclosed herein are not limited to one hidden layer. The data flow from the input layer to the output layer is performed as follows. The input layer ($x_1, x_2, \ldots x_m$) is associated with the data input 132 to the physics-constrained machine learning model 116. To train the physics-constrained machine learning model 116, the computer system 100 updates the weights (such as $w_{hi}$ and $v_{jh}$) of the artificial neural network 140 to minimize a difference between the predicted hydrocarbon production for the multiple reservoirs and the measured hydrocarbon production rates 208. The data of the hidden layer 308 is thus determined as follows: $b_h = f(\alpha_h)$; and $\alpha_h = \Sigma_{j=1}^{m} v_{jh} x_j$, where $v_{jh}$ denotes a weight for the connection between the nodes $x_j$ and $b_h$. In some implementations, the function $f$ is represented by $$f(z) = \frac{1}{1+\exp(-z)}.$$

In other implementations, the function $f$ is represented by $f(z)=\max(0, z)$.

Once the values of $b_h$ (h=1, ... q) have been determined, the output values of the output layer are determined as $y_i = f(\beta_i)$; and $\beta_i = \Sigma_{h=1}^{q} w_{hi} b_h$, where $w_{hi}$ denotes a weight for the connection between $y_i$ and $b_h$. The values $y_i$ (i=1, ... l) are the input parameters 136 of the hydrocarbon fluid flow model 104. Therefore, the hydrocarbon production rate R is determined as $R(t)=M(y_1, y_2, \ldots, y_l, t)$, where t represents time and M denotes the hydrocarbon fluid flow model 104 illustrated and described in more detail later with reference to FIG. 4.

The weights of the physics-constrained machine learning model 116 are determined by comparing the prediction results of the physics-constrained machine learning model 116 with observations in the training data 120. To obtain the correct weights, the computer system 100 updates the weights by minimizing a difference between the predictions and observations defined by a loss function denoted as $E=\Sigma_{g=1}^{e}(R_g-R_{g,obs})^2$, where $R_{g,obs}$ denotes the $g^{th}$ observation (production rate). Using the gradient descent method, the computer system 100 updates the weight $w_{hi}$ by adding the following increment:

$$\Delta w_{hi} = -\varepsilon \frac{\partial E}{\partial w_{hi}},$$

where ε is an empirical parameter generally assigned a value larger than zero and smaller than one. The derivative is determined as $$\frac{\partial E}{\partial w_{hi}} = \sum_{g=1}^{e} \frac{\partial E}{\partial R_g} \frac{\partial R_g}{\partial y_i} \frac{\partial y_i}{\partial \beta_i} \frac{\partial \beta_i}{\partial w_{hi}}.$$

Similar, the weight $v_{jh}$ is updated by adding the following increment:

$$\Delta v_{jh} = -\varepsilon \frac{\partial E}{\partial v_{jh}}.$$

The derivative $$\frac{\partial E}{\partial v_{jh}}$$

in the equation above is obtained using the chain rule as:

$$\frac{\partial E}{\partial v_{jh}} = \sum_{g=1}^{e} \frac{\partial E}{\partial R_g} \sum_{i=1}^{l} \frac{\partial R_g}{\partial y_i} \frac{\partial y_i}{\partial \beta_i} \frac{\partial \beta_i}{\partial b_h} \frac{\partial b_h}{\partial \alpha_h} \frac{\partial \alpha_h}{\partial v_{jh}}.$$

The procedure described above for updating the weights is sometimes referred to as backpropagation. Initially, the computer system 100 assigns initial guesses of the weights and then updates the weights using backpropagation. The backpropagation is repeated several times until the loss function does not decrease further with further updating of the weights. The minimized loss function is considered to be achieved and the training is complete. The trained physics-constrained machine learning model 116 is then used for predicting the hydrocarbon production rates.

Figure 4:
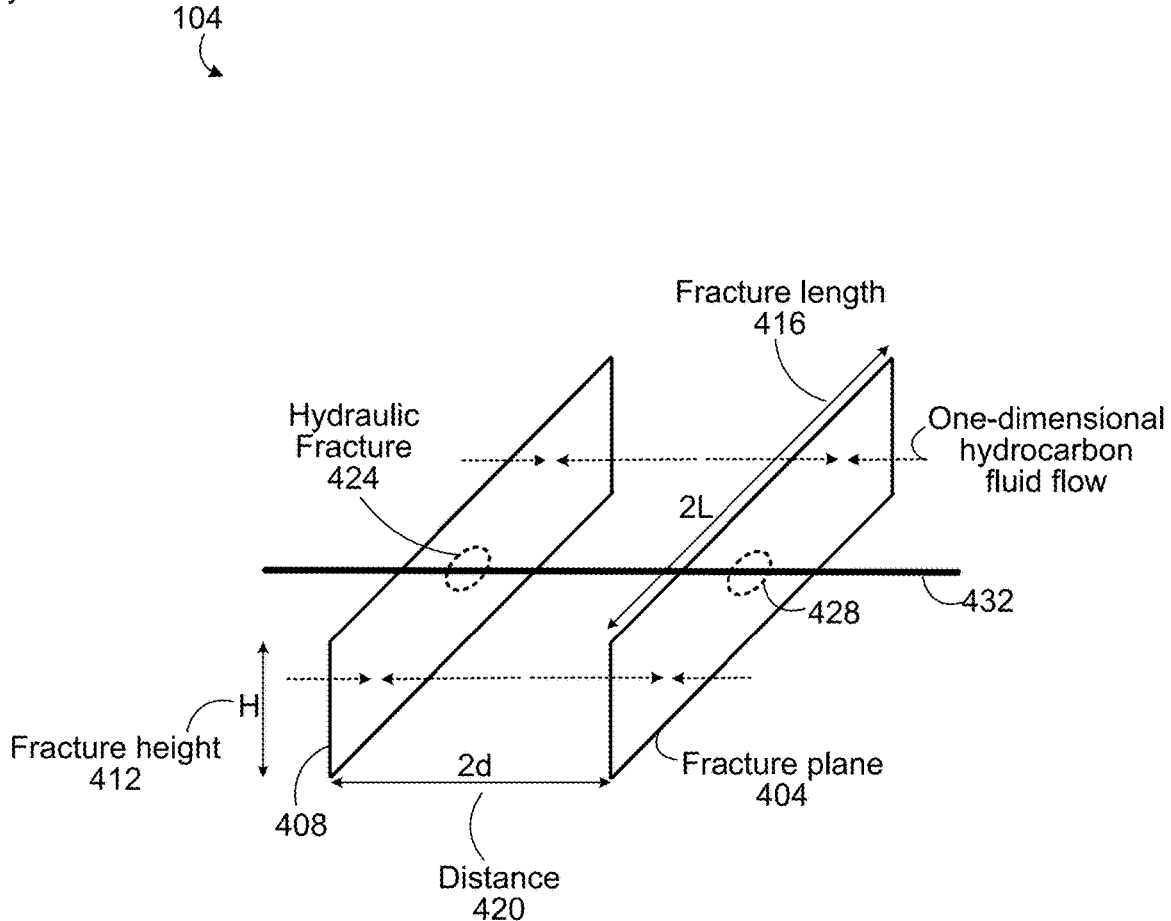
FIG. 4 illustrates a physics-based hydrocarbon fluid flow model for predicting hydrocarbon production rates for an unconventional hydrocarbon reservoir, in accordance with one or more implementations.

FIG. 4 illustrates a physics-based hydrocarbon fluid flow model 104 for predicting hydrocarbon production rates of an unconventional hydrocarbon reservoir 128, according to some implementations. The hydrocarbon fluid flow model 104 includes two fracture planes 404, 408, a horizontal well 432, and two hydraulic fractures 424, 428.

The hydrocarbon fluid flow model 104 illustrated in FIG. 4 represents a shale gas reservoir. The hydrocarbon fluid flow model 104 includes two adjacent hydraulic fractures 424, 428 having a height H, a length 2L, and spacing 2d between them. Since the hydraulic fracture permeability is greater than the reservoir permeability, the hydrocarbon fluid flow model 104 assumes a zero flow resistance within each hydraulic fracture. The hydrocarbon production process is represented by a one-dimensional fluid flow from the hydrocarbon reservoir 128 to the hydraulic fractures 424, 428. The one-dimensional fluid flow is simulated either using numerical methods or analytical methods.

As described in more detail with reference to FIG. 2, the physics-based machine learning model 116 predicts the hydrocarbon production rate for the hydrocarbon reservoir 128 as a function of time. The physics-based machine learning model 116 includes the artificial neural network 204, which generates the parameters 136 of the hydrocarbon fluid flow model 104. The parameters 136 include a total hydraulic fracture area of the hydrocarbon reservoir 128. The total hydraulic fracture area refers to the contact areas with the target formation (sedimentary bed). The parameters 136 include an average fracture spacing of the hydrocarbon reservoir 128. The average fracture spacing of fractures in reservoir rocks refers to an average distance between parallel fractures in a subsurface joint set. The parameters 136 include a permeability and a porosity of the hydrocarbon reservoir 128. Permeability and porosity are described in more detail with reference to FIG. 1. The parameters 136 include a hydrocarbon in place (HIP) metric of the hydrocarbon reservoir 128. The HIP metric refers to a total hydrocarbon content of the hydrocarbon reservoir 128. The HIP metric is estimated from the other parameters that are measured prior to drilling or after production has begun.

The parameters 136 include a pressure drawdown of the hydrocarbon reservoir 128. The pressure drawdown refers to a difference between the reservoir pressure and the flowing wellbore pressure, which drives fluids from the hydrocarbon reservoir 128 into the wellbore. The parameters 136 include PVT data for producing fluids in the hydrocarbon reservoir 128. PVT data is described in more detail with reference to FIG. 1. When a parameter is known with a small uncertainty, it is directly used in the hydrocarbon fluid flow model 104. Else, the parameter is estimated by the physics-constrained machine learning model 116. For example, the fracture surface area and reservoir permeability are difficult to determine with certainty; therefore they are estimated by the physics-constrained machine learning model 116.

Once the parameters 136 are generated, the hydrocarbon fluid flow model 104 provides the hydrocarbon production rate for the hydrocarbon reservoir 128 as a function of time. As disclosed with reference to FIG. 3, the values of the output layer of the artificial neural network 204 are determined as $y_i = f(\beta_i)$; and $\beta_i = \Sigma_{h=1}^{q} w_{hi} b_h$, where $w_{hi}$ denotes a weight for the connection between $y_i$ and $b_h$. The values $y_i$ (i=1, ... l) represent the parameters 136 for the hydrocarbon fluid flow model 104. The hydrocarbon production rate R is determined as $R(t) = M(y_1, y_2, \ldots, y_l, t)$, where t represents time and M denotes the hydrocarbon fluid flow model 104.

FIG. 5 illustrates a process 500 for predicting hydrocarbon production rates of an unconventional hydrocarbon reservoir 128, in accordance with one or more implementations. In some implementations, the process 500 is performed by the computer system 100.

The computer system 100 receives 504 data 132 from a hydrocarbon reservoir 128 as illustrated and described in more detail with reference to FIG. 1. The data 132 includes reservoir characterization data, well log data, and hydraulic fracturing data of the hydrocarbon reservoir 128. The computer system 100 includes a physics-constrained machine learning model 116 as illustrated and described in more detail with reference to FIG. 1.

The computer system 100 generates 508 a predicted hydrocarbon production rate for the hydrocarbon reservoir 128 as a function of time by the physics-constrained machine learning model 116. The physics-constrained machine learning model 116 includes an artificial neural network 140 and a hydrocarbon fluid flow model 104 of the hydrocarbon reservoir 128 as illustrated and described in more detail with reference to FIG. 2. Generation of the predicted hydrocarbon production rate includes generating parameters 136 of the hydrocarbon fluid flow model 104 based on the data 132 from the hydrocarbon reservoir 128 by the artificial neural network 140. The hydrocarbon fluid flow model 104 is communicably coupled to the artificial neural network 140 in a manner to constrain the outputs of the artificial neural network 140. The artificial neural network 140 is thus constrained to provide meaningful outputs in accordance with the physics-based fluid flow of the hydrocarbon reservoir 128. Generation of the predicted hydrocarbon production rate further includes providing the predicted hydrocarbon production rate as a function of time based on the parameters 136 by the hydrocarbon fluid flow model 104.

The computer system 100 presents 512 the predicted hydrocarbon production rate for the hydrocarbon reservoir 128 as a function of time by a display device 124 of the computer system 100. In some implementations, the display device 124 presents a predicted hydrocarbon production rate, such as a number of 42-gallon barrels ("bbl.") or metric tonnes per day. In other implementations, the display device 124 presents a determination of whether to drill a hydrocarbon production well at a particular geographical location corresponding to the hydrocarbon reservoir 128 based on the predicted hydrocarbon production rates. For example, if the predicted hydrocarbon production rate at a particular time is greater than a threshold (such as 150,000 bbl./day), the display device 124 signals that the location is a "sweet spot" for drilling a production well.

FIG. 6 shows an implementation of the computer system 100. In the implementation of FIG. 6, the computer system 100 is a special purpose computing device. The special-purpose computing device is hard-wired to perform determination of hydrocarbon production rates from an unconventional hydrocarbon reservoir 128, or includes digital electronic devices such as one or more application-specific integrated circuits (ASICs) or field programmable gate arrays (FPGAs) that are persistently programmed to perform the techniques herein, or include one or more general purpose hardware processors programmed to perform the techniques pursuant to program instructions in firmware, memory, other storage, or a combination. In various implementations, the special-purpose computing devices are desktop computer systems, portable computer systems, handheld devices, network devices or any other device that incorporates both hard-wired or program logic to implement the techniques.

The computer system 100 includes a bus 602 or other communication mechanism for communicating information, and one or more computer hardware processors 108 coupled to the bus 602 for processing information. In some implementations, the hardware processors 108 are general-purpose microprocessors. The computer system 100 also includes a main memory 606, such as a random-access memory (RAM) or other dynamic storage device, coupled to the bus 602 for storing information and instructions to be executed by processors 108. In one implementation, the main memory 606 is used for storing temporary variables or other intermediate information during execution of instructions to be executed by the processors 108. Such instructions, when stored in non-transitory storage media accessible to the processors 108, render the computer system 100 into a special-purpose machine customized to perform the operations specified in the instructions.

In an implementation, the computer system 100 further includes a read only memory (ROM) 608 or other static storage device coupled to the bus 602 for storing static information and instructions for the processors 108. A storage device 112, such as a magnetic disk, optical disk, solid-state drive, or three-dimensional cross point memory is provided and coupled to the bus 602 for storing information and instructions.

In an implementation, the computer system 100 is coupled via the bus 602 to a display 124, such as a cathode ray tube (CRT), a liquid crystal display (LCD), plasma display, light emitting diode (LED) display, or an organic light emitting diode (OLED) display for displaying information to a computer user. An input device 614, including alphanumeric and other keys, is coupled to bus 602 for communicating information and command selections to the processors 108. Another type of user input device is a cursor controller 616, such as a mouse, a trackball, a touch-enabled display, or cursor direction keys for communicating direction information and command selections to the processors 108 and for controlling cursor movement on the display 124.

According to one implementation, the techniques herein are performed by the computer system 100 in response to the processors 108 executing one or more sequences of one or more instructions contained in the main memory 606. Such instructions are read into the main memory 606 from another storage medium, such as the storage device 112. Execution of the sequences of instructions contained in the main memory 606 causes the processors 108 to perform the process steps described herein. In alternative implementations, hard-wired circuitry is used in place of or in combination with software instructions.

The term "storage media" as used herein refers to any non-transitory media that store both data or instructions that cause a machine to operate in a specific fashion. Such storage media includes both non-volatile media or volatile media. Non-volatile media includes, such as optical disks, magnetic disks, solid-state drives, or three-dimensional cross point memory, such as the storage device 112. Common forms of storage media include, such as a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NV-RAM, or any other memory chip or cartridge. Storage media is distinct from but is used in conjunction with transmission media. Transmission media participates in transferring information between storage media. Transmission media includes coaxial cables, copper wire and fiber optics, including the wires that comprise the bus 602.

In an implementation, various forms of media are involved in carrying one or more sequences of one or more instructions to the processors 108 for execution. The instructions are initially carried on a magnetic disk or solid-state drive of a remote computer. The remote computer loads the instructions into its dynamic memory and send the instructions over a telephone line using a modem. A modem local to the computer system 100 receives the data on the telephone line and use an infrared transmitter to convert the data to an infrared signal. An infrared detector receives the data carried in the infrared signal and appropriate circuitry places the data on the bus 602. The bus 602 carries the data to the main memory 606, from which processors 108 retrieves and executes the instructions. The instructions received by the main memory 606 are optionally stored on the storage device 112 either before or after execution by processors 108.

The computer system 100 also includes a communication interface 618 coupled to the bus 602. The communication interface 618 provides a two-way data communication coupling to a network link 620 connected to a local network 622. The communication interface 618 is an integrated service digital network (ISDN) card, cable modem, satellite modem, or a modem to provide a data communication connection to a corresponding type of telephone line. In another implementation, the communication interface 618 is a local area network (LAN) card to provide a data communication connection to a compatible LAN. In some implementations, wireless links are also implemented.

The network link 620 typically provides data communication through one or more networks to other data devices. The network link 620 provides a connection through the local network 622 to a host computer 624 or to a cloud data center or equipment operated by an Internet Service Provider (ISP) 626. The ISP 626 in turn provides data communication services through the world-wide packet data communication network now commonly referred to as the "Internet" 628. The local network 622 and Internet 628 both use electrical, electromagnetic or optical signals that carry digital data streams.

What is claimed is:

1. A method comprising:
    receiving, by a computer system, data from a hydrocarbon reservoir, the data comprising reservoir characterization data, well log data, and hydraulic fracturing data of the hydrocarbon reservoir, the computer system comprising a physics-constrained machine learning model;
    generating, by the physics-constrained machine learning model, a predicted hydrocarbon production rate for the hydrocarbon reservoir as a function of time, the physics-constrained machine learning model comprising an artificial neural network and a hydrocarbon fluid flow model of the hydrocarbon reservoir, the generating of the predicted hydrocarbon production rate comprising:
        generating, by the artificial neural network, a plurality of parameters of the hydrocarbon fluid flow model based on the data from the hydrocarbon reservoir, the hydrocarbon fluid flow model communicably coupled to the artificial neural network, wherein the plurality of parameters of the hydrocarbon fluid flow model comprise a total hydraulic fracture area of the hydrocarbon reservoir, an average fracture spacing of the hydrocarbon reservoir, a permeability and a porosity of the hydrocarbon reservoir, a hydrocarbon in place (HIP) metric of the hydrocarbon reservoir, a pressure drawdown of the hydrocarbon reservoir, and pressure-volume-temperature (PVT) data for producing fluids in the hydrocarbon reservoir; and
        providing, by the hydrocarbon fluid flow model, the predicted hydrocarbon production rate as a function of time based on the plurality of parameters; and
    presenting, using a display device of the computer system, the predicted hydrocarbon production rate for the hydrocarbon reservoir as a function of time.

2. The method of claim 1, wherein the data from the hydrocarbon reservoir comprises at least one of:
    a bottomhole pressure of the hydrocarbon reservoir;
    a wellhead pressure of the hydrocarbon reservoir;
    reservoir fluid pressure-volume-temperature (PVT) data of the hydrocarbon reservoir;
    a permeability and a porosity of the hydrocarbon reservoir;
    an initial reservoir pore pressure of the hydrocarbon reservoir; or
    formation layer data of the hydrocarbon reservoir.

3. The method of claim 1, wherein the data from the hydrocarbon reservoir comprises at least one of:
    a hydraulic fracture geometry of the hydrocarbon reservoir;
    an injection rate of the hydrocarbon reservoir; or
    a mineral composition and an in situ stress of the hydrocarbon reservoir.

4. The method of claim 1, wherein the hydrocarbon fluid flow model of the hydrocarbon reservoir represents a one-dimensional hydrocarbon fluid flow from the hydrocarbon reservoir to one or more hydraulic fractures.

5. The method of claim 1, further comprising:
    generating, by the computer system, training data for the physics-constrained machine learning model, the training data comprising:
        measured reservoir characterization data and measured hydraulic fracturing data of a plurality of hydrocarbon reservoirs; and
        measured hydrocarbon production rates and measured flowback rates of the plurality of hydrocarbon reservoirs; and
    training, by the computer system, the physics-constrained machine learning model to generate predicted hydrocarbon production rates as a function of time for the plurality of hydrocarbon reservoirs based on the training data.

6. The method of claim 5, wherein the training of the physics-constrained machine learning model comprises:
    updating, by the computer system, a plurality of weights of the artificial neural network to minimize a difference between the predicted hydrocarbon production for the plurality of hydrocarbon reservoirs and the measured hydrocarbon production rates.

7. The method of claim 1, further comprising:
    determining, using the computer system, whether to drill a production well at a particular geographical location corresponding to the hydrocarbon reservoir, the determining based on the predicted hydrocarbon production rate for the hydrocarbon reservoir as a function of time.

8. A non-transitory computer-readable storage medium storing instructions executable by a computer system, the instructions when executed by the computer system cause the computer system to:
    receive data from a hydrocarbon reservoir, the data comprising reservoir characterization data, well log data, and hydraulic fracturing data of the hydrocarbon reservoir, the computer system comprising a physics-constrained machine learning model;
    generate, by the physics-constrained machine learning model, a predicted hydrocarbon production rate for the hydrocarbon reservoir as a function of time, the physics-constrained machine learning model comprising an artificial neural network and a hydrocarbon fluid flow model of the hydrocarbon reservoir, the generating of the predicted hydrocarbon production rate comprising:
        generating, by the artificial neural network, a plurality of parameters of the hydrocarbon fluid flow model based on the data from the hydrocarbon reservoir, the hydrocarbon fluid flow model communicably coupled to the artificial neural network, wherein the plurality of parameters of the hydrocarbon fluid flow model comprise a total hydraulic fracture area of the hydrocarbon reservoir, an average fracture spacing of the hydrocarbon reservoir, a permeability and a porosity of the hydrocarbon reservoir, a hydrocarbon in place (HIP) metric of the hydrocarbon reservoir, a pressure drawdown of the hydrocarbon reservoir, and pressure-volume-temperature (PVT) data for producing fluids in the hydrocarbon reservoir; and providing, by the hydrocarbon fluid flow model, the predicted hydrocarbon production rate as a function of time based on the plurality of parameters; and present, using a display device of the computer system, the predicted hydrocarbon production rate for the hydrocarbon reservoir as a function of time.

9. The non-transitory computer-readable storage medium of claim 8, wherein the data from the hydrocarbon reservoir comprises at least one of:
a bottomhole pressure of the hydrocarbon reservoir;
a wellhead pressure of the hydrocarbon reservoir;
reservoir fluid pressure-volume-temperature (PVT) data of the hydrocarbon reservoir;
an initial reservoir pore pressure of the hydrocarbon reservoir; or
formation layer data of the hydrocarbon reservoir.

10. The non-transitory computer-readable storage medium of claim 8, wherein the data from the hydrocarbon reservoir comprises at least one of:
a hydraulic fracture geometry of the hydrocarbon reservoir;
an injection rate of the hydrocarbon reservoir; or
a mineral composition and an in situ stress of the hydrocarbon reservoir.

11. The non-transitory computer-readable storage medium of claim 8, wherein the hydrocarbon fluid flow model of the hydrocarbon reservoir represents a one-dimensional hydrocarbon fluid flow from the hydrocarbon reservoir to one or more hydraulic fractures.

12. The non-transitory computer-readable storage medium of claim 8, wherein the instructions further cause the computer system to:
generate training data for the physics-constrained machine learning model, the training data comprising:
measured reservoir characterization data and measured hydraulic fracturing data of a plurality of hydrocarbon reservoirs; and
measured hydrocarbon production rates and measured flowback rates of the plurality of hydrocarbon reservoirs; and
train the physics-constrained machine learning model to generate predicted hydrocarbon production rates as a function of time for the plurality of hydrocarbon reservoirs based on the training data.

13. The non-transitory computer-readable storage medium of claim 12, wherein the training of the physics-constrained machine learning model comprises:
updating a plurality of weights of the artificial neural network to minimize a difference between the predicted hydrocarbon production for the plurality of hydrocarbon reservoirs and the measured hydrocarbon production rates.

14. The non-transitory computer-readable storage medium of claim 8, wherein the instructions further cause the computer system to:
determine whether to drill a production well at a particular geographical location corresponding to the hydrocarbon reservoir, the determining based on the predicted hydrocarbon production rate for the hydrocarbon reservoir as a function of time.

15. A computer system comprising:
one or more computer processors; and
a non-transitory computer-readable storage medium storing instructions executable by the one or more computer processors, the instructions when executed by the one or more computer processors cause the one or more computer processors to:
receive data from a hydrocarbon reservoir, the data comprising reservoir characterization data, well log data, and hydraulic fracturing data of the hydrocarbon reservoir, the computer system comprising a physics-constrained machine learning model;
generate, by the physics-constrained machine learning model, a predicted hydrocarbon production rate for the hydrocarbon reservoir as a function of time, the physics-constrained machine learning model comprising an artificial neural network and a hydrocarbon fluid flow model of the hydrocarbon reservoir, the generating of the predicted hydrocarbon production rate comprising:
generating, by the artificial neural network, a plurality of parameters of the hydrocarbon fluid flow model based on the data from the hydrocarbon reservoir, the hydrocarbon fluid flow model communicably coupled to the artificial neural network, wherein the plurality of parameters of the hydrocarbon fluid flow model comprise a total hydraulic fracture area of the hydrocarbon reservoir, an average fracture spacing of the hydrocarbon reservoir, a permeability and a porosity of the hydrocarbon reservoir, a hydrocarbon in place (HIP) metric of the hydrocarbon reservoir, a pressure drawdown of the hydrocarbon reservoir, and pressure-volume-temperature (PVT) data for producing fluids in the hydrocarbon reservoir; and
providing, by the hydrocarbon fluid flow model, the predicted hydrocarbon production rate as a function of time based on the plurality of parameters; and
present, using a display device of the computer system, the predicted hydrocarbon production rate for the hydrocarbon reservoir as a function of time.

16. The computer system of claim 15, wherein the data from the hydrocarbon reservoir comprises at least one of:
a bottomhole pressure of the hydrocarbon reservoir;
a wellhead pressure of the hydrocarbon reservoir;
reservoir fluid pressure-volume-temperature (PVT) data of the hydrocarbon reservoir;
an initial reservoir pore pressure of the hydrocarbon reservoir; or
formation layer data of the hydrocarbon reservoir.

17. The computer system of claim 15, wherein the data from the hydrocarbon reservoir comprises at least one of:
a hydraulic fracture geometry of the hydrocarbon reservoir;
an injection rate of the hydrocarbon reservoir; or
a mineral composition and an in situ stress of the hydrocarbon reservoir.

18. The computer system of claim 15, wherein the hydrocarbon fluid flow model of the hydrocarbon reservoir represents a one-dimensional hydrocarbon fluid flow from the hydrocarbon reservoir to one or more hydraulic fractures.

* * * * *